(12) United States Patent
Chai et al.

(10) Patent No.: US 7,063,930 B2
(45) Date of Patent: Jun. 20, 2006

(54) CHEMICAL RINSE COMPOSITION

(75) Inventors: Yung-Bae Chai, Cheonan (KR); Si-Myung Choi, Busan (KR); Jae-Sung Ro, Cheonan (KR); Jung-Sun Choi, Cheonan (KR)

(73) Assignee: Samsung Electronics Co., Ltd. (KR)

( * ) Notice: Subject to any disclaimer, the term of this patent is extended or adjusted under 35 U.S.C. 154(b) by 21 days.

(21) Appl. No.: 10/495,056

(22) PCT Filed: Nov. 13, 2002

(86) PCT No.: PCT/KR02/02117

§ 371 (c)(1),
(2), (4) Date: Oct. 21, 2004

(87) PCT Pub. No.: WO03/042762

PCT Pub. Date: May 22, 2003

(65) Prior Publication Data

US 2005/0058953 A1 Mar. 17, 2005

(30) Foreign Application Priority Data

Nov. 13, 2001 (KR) ...................... 10-2001-0070364

(51) Int. Cl.
*G03F 7/42* (2006.01)

(52) U.S. Cl. ...................... 430/256; 430/257; 430/258; 430/260; 430/261; 430/262; 430/263; 430/331; 510/175

(58) Field of Classification Search ................ 430/256, 430/257, 258, 260, 261, 262, 263, 331; 510/175
See application file for complete search history.

(56) References Cited

U.S. PATENT DOCUMENTS

| | | | | |
|---|---|---|---|---|
| 5,821,208 A | 10/1998 | Cala et al. | ................... | 510/175 |
| 5,962,197 A | 10/1999 | Chen | .......................... | 430/331 |
| 6,274,296 B1 | 8/2001 | Chu | .......................... | 430/331 |
| 6,379,875 B1 | 4/2002 | Chu | .......................... | 430/329 |
| 6,417,147 B1 | 7/2002 | Amemiya et al. | .......... | 510/175 |

FOREIGN PATENT DOCUMENTS

| | | |
|---|---|---|
| JP | 63-231343 | 9/1988 |
| JP | 8-87118 | 4/1996 |
| KR | 2002-0063096 | 8/2002 |
| KR | 2003-0000359 | 1/2003 |

OTHER PUBLICATIONS

PCT International Search Report; International application No. PCT/KR02/02117; International filing date: Nov. 13, 2002; Date of Mailing: Mar. 13, 2003.

*Primary Examiner*—Hoa Van Le
(74) *Attorney, Agent, or Firm*—Cantor Colburn LLP

(57) ABSTRACT

The present invention relates to a thinner composition for removing resist used in TFT-LCD manufacturing processes, and more particularly to a thinner composition for removing resist that comprises: a) 0.1 to 5 wt % of an inorganic alkali compound; b) 0.1 to 5 wt % of an organic amine; c) 0.1 to 30 wt % of an organic solvent; d) 0.01 to 5 wt % of a surfactant comprising an ionic surfactant and a non-ionic surfactant in the weight ration of 1:5 to 1:25; and e) 60 to 99 wt % of water. The thinner composition for removing resist of the present invention has good efficiency of removing unwanted resist film constituents formed on the edge of the resist film or at the back of the substrate in TFT-LCD device and semiconductor device manufacturing processes. Also, it does not have the problem of equipment corrosion.

6 Claims, No Drawings

CHEMICAL RINSE COMPOSITION

BACKGROUND OF THE INVENTION (a) Field of the Invention

The present invention relates to a thinner composition for removing photosensitive resin (resist) film, used in TFT-LCD (thin film transistor liquid crystal display) and semiconductor device manufacturing processes, and more particularly to a thinner composition capable of effectively removing unnecessary film constituents formed at edges of the resist film coated on the substrate or formed at the back of the substrate during manufacturing processes of TFT-LCD devices and semiconductor devices.

(b) Description of the Related Art

In pattern formation of a fine circuit like a TFT-LCD circuit or a semiconductor integrated circuit, a resist composition is uniformly coated or applied on an insulation film or a conductive metal film formed on the substrate. Then, the coated resist composition is exposed and developed in the presence of a mask having a certain pattern to acquire the pattern. The metal film or the insulation film is etched using the patterned resist film as mask, and the remaining resist film is removed to form a fine circuit. When manufacturing TFT-LCDs or semiconductor devices with this lithography method, the resist film should be formed on a substrate such as glass or silicon wafer, and the substrate should be rinsed with a thinner prior to exposure and developing of the resist film, in order to remove unnecessary resist constituents on the edge of the formed resist film and unnecessary resist film formed at the back of the substrate.

For thinners to rinse and remove the resist film on the substrate, water, inorganic and organic alkaline thinners, and organic amine thinners like monoethanolamine are known. With the inorganic alkaline thinners, inorganic materials remain after removing unnecessary films, so that they may contaminate the processing equipment, and the removing efficiency is poor. Therefore, organic alkalis and organic amines are used as main components of the thinner, and inorganic alkalis as minor components. The organic alkalis and organic amines leave few unwanted materials after they are evaporated, so that they do not corrode the equipment. Additionally, since they have good solubility to the resist, they have superior resist-removing efficiency.

Other thinner compositions comprise inorganic alkalis like potassium hydroxide, sodium hydroxide, sodium phosphate, sodium silicate, sodium carbonate, or sodium hydrogen carbonate; organic alkalis like tetramethylammonium hydroxide; and organic solvents like dipropyleneglycol monomethylether, propyleneglycol monomethylether, propyleneglycol monomethyl ether acetate, or n-butyl acetate. However, these organic solvents do not offer sufficient resist-removing efficiency, and in particular, an increase in the content of inorganic alkalis causes problems with equipment corrosion after evaporation.

Therefore, development of a new thinner composition having superior resist-removing efficiency and that is capable of preventing equipment corrosion is needed.

SUMMARY OF THE INVENTION

The present invention was made in consideration of the problems of the prior art, and it is an object of the present invention to provide a thinner composition for removing a resist in TFT-LCD device and semiconductor device manufacturing processes, having superior resist removing efficiency and that is capable of preventing equipment corrosion.

In order to achieve this object, the present invention provides a thinner composition for removing resist comprising: a) 0.1 to 5 wt % of an inorganic alkali compound; b) 0.1 to 5 wt % of an organic amine; c) 0.1 to 30 wt % of an organic solvent; d) 0.01 to 5 wt % of a surfactant comprising an anionic surfactant and a non-ionic surfactant in the weight ratio of 1:5 to 1:25; and e) 60 to 99 wt % of water.

DETAILED DESCRIPTION OF THE PREFERRED EMBODIMENTS

The present invention will now be explained in more detail.

The present inventors identified that a composition comprising one or more inorganic alkalis, an organic amine, one or more organic solvents, and a surfactant in a specific ratio has resist-removing efficiency and prevents equipment corrosion.

In a thinner composition for removing a resist of the present invention, the inorganic alkali (a) can be one or more compounds selected from potassium hydroxide, sodium hydroxide, sodium phosphate, sodium silicate, sodium carbonate, and sodium hydrogen carbonate. The content of the inorganic alkali compound to the entire thinner composition is preferably 0.1 to 5 wt %, and more preferably, 0.5 to 3 wt %. If the content is below 0.5 wt %, the resist-removing efficiency becomes poor because the composition does not penetrate into the resist well. Otherwise, if it exceeds 5 wt %, equipment corrosion may arise after evaporation of the thinner composition, and development may be insufficient due to buildup of the thinner composition on the border of the resist removal area because of excessive penetration.

In the thinner composition for removing resist of the present invention, the organic amine (b) can be one or more compounds selected from monoethanolamine, diethanolamine, triethanolamine, monoethylamine, diethylamine, triethylamine, ethyleneglycol amine, propyleneglycol amine, butyleneglycol amine, diethyleneglycol amine, and dipropyleneglycol amine. The content of the organic amine to the entire thinner composition is preferably 0.1 to 5 wt %, and more preferably 1 to 4 wt %. If the content is below 0.1 wt %, penetration into the resist polymer is weakened, so that the resist-removing rate is reduced. Otherwise, if it exceeds 5 wt %, development may be insufficient due to buildup of the thinner composition on the resist-removal border because of excessive penetration.

Additionally, in the thinner composition for removing resist of the present invention, the organic solvent (c) is preferably a compound that is miscible with water and that sufficiently dissolves the resist and organic amine compound. To be specific, one or more compounds selected from ethyleneglycol phenylether, propyleneglycol phenylether, butyleneglycol phenylether, diethyleneglycol phenylether, dipropyleneglycol phenylether, dipropyleneglycol monomethylether, diethyleneglycol monoethyleneether, propyleneglycol monomethylether, propyleneglycol monomethylether acetate, N-methylpyrrolidone (NMP), N-ethyl pyrrolidone (NEP), N-propyl pyrrolidone (NPP), N-hydroxymethyl pyrrolidone, and N-hydroxyethyl pyrrolidone can be used. The content of the organic solvent is preferably 0.1 to 30 wt %, and more preferably 1 to 10 wt %. If the content is below 0.1 wt %, the solubility to the resist and organic amine compound becomes poor. Otherwise, if it exceeds 30 wt %, treatment of the waste solution becomes a problem.

In the thinner composition for removing resist of the present invention, the surfactant (d) is preferably a mixture of an anionic surfactant and a non-ionic surfactant. The surfactant should be miscible with water and soluble in the organic solvent. The anionic surfactant increases solubility to the organic solvent and water. For the anionic surfactant, sodium lauryl sulfate, sodium alkyl sulfate, etc. can be used. For the non-ionic surfactant, polyoxyethethyl ether, polyoxypropyl ether, polyoxyethyl octylphenyl ether, polyoxypropyl octylphenyl ether, polyoxyethyl propyl ether, polyoxyethylpropyl octylphenyl ether, and a mixture thereof can be used. The mixing ratio (weight ratio) of the anionic surfactant and non-ionic surfactant is preferably 1:5 to 1:25. If the mixing ratio is below 1:5, solubility to the organic solvent and water is poor. Otherwise, if it exceeds 1:25, the resist removing efficiency becomes poor. The content of the surfactant is preferably 0.01 to 5 wt %. If the content is below 0.01 wt %, mixing of the organic amine, organic solvent, and water is difficult. Otherwise, if it exceeds 5 wt %, the resist-removing efficiency of the thinner composition becomes poor.

In the thinner composition for removing resist of the present invention, water (e), an essential constituent, is preferably pure water filtered through an ion-exchange resin, and more preferably ultrapure water whose specific resistance is larger than 18 M Ω. The content of water to the entire thinner composition is preferably 60 to 99 wt %. If the content is below 60 wt %, treatment of the waste solution becomes a problem. Otherwise, if it exceeds 99 wt %, the resist-removing efficiency becomes poor.

The thinner composition according to the present invention can solve the problems of insufficient rinsing efficiency and contamination of equipment of the conventional mixture of inorganic alkalis like potassium hydroxide, sodium hydroxide, sodium phosphate, sodium silicate, sodium carbonate, and sodium hydrogen carbonate; organic alkalis like tetramethylammonium hydroxide; and organic solvents like dipropyleneglycol monomethylether, propyleneglycol monomethylether, propyleneglycol monomethyl acetate, and n-butyl acetate. In particular, it can remove even fine resist films.

Hereinafter, the present invention is described in more detail through Examples. However, the following Examples are only for the understanding of the present invention, and the present invention is not limited to the following Examples. In the following Examples, the percentage and mixing ratio are based on weight, unless otherwise mentioned.

EXAMPLE

Examples 1 to 8 and Comparative Examples 1 to 4

Thinner compositions of Examples 1 to 8 and Comparative Examples 1 to 4 were prepared by mixing organic amines, organic solvents, surfactants, and water, in the ratios shown in Table 1.

TABLE 1

| Contents (wt %) | | Examples | | | | | | | | Comparative Examples | | | |
|---|---|---|---|---|---|---|---|---|---|---|---|---|---|
| | | 1 | 2 | 3 | 4 | 5 | 6 | 7 | 8 | 1 | 2 | 3 | 4 |
| (a) Inorganic alkali | KOH | 0.5 | 0.5 | 0.5 | 1.0 | 1.0 | 1.0 | 0.5 | 0.5 | — | — | — | — |
| | Na₂CO₃ | 1.0 | 1.0 | 1.0 | 2.0 | 2.0 | 2.0 | 2.0 | 2.0 | — | — | — | — |
| | NaOH | — | — | — | — | — | — | — | — | 0.3 | 6.0 | — | — |
| | TMAH | — | — | — | — | — | — | — | — | — | — | 0.6 | 0.6 |
| (b) Organic amine | MEA | 0.5 | — | — | — | — | — | 0.5 | — | — | — | — | — |
| | DEGA | — | — | — | 0.5 | — | — | — | — | — | — | — | — |
| | TEA | — | 0.5 | — | — | 0.5 | — | — | 0.5 | — | — | — | — |
| | TEOA | — | — | 0.5 | — | — | 0.5 | — | — | — | — | — | — |
| (c) Organic solvent | NMP | 1.0 | 1.0 | 1.0 | — | — | 3.0 | 3.0 | 3.0 | — | — | — | — |
| | PPOH | 1.0 | — | — | 1.0 | 1.0 | 1.0 | — | — | — | — | — | — |
| | DPGME | — | 3.0 | — | 5.0 | — | — | 5.0 | — | — | 5.0 | — | 5.0 |
| | PGMEA | — | — | 3.0 | — | 5.0 | — | — | 5.0 | — | — | — | — |
| | nBA | — | — | — | — | — | — | — | — | 5.0 | 5.0 | 5.0 | 5.0 |
| | PGME | — | — | — | — | — | — | — | — | 5.0 | — | 5.0 | — |
| (d) Surfactant | POEO | 1.0 | 1.0 | 1.0 | 1.0 | 2.0 | 2.0 | 2.0 | 2.0 | — | — | — | — |
| | ES | 0.1 | 0.1 | 0.1 | 0.1 | 0.1 | 0.1 | 0.1 | 0.1 | — | — | — | — |
| (e) Water | | 94.9 | 92.9 | 92.9 | 89.4 | 88.4 | 90.4 | 86.9 | 86.9 | 89.7 | 84.0 | 89.4 | 89.4 |

In Table 1, TMAH is tetramethylammonium hydroxide, MEA is monoethanolamine, DEGA is diethyleneglycol amine, TEA is triethylamine, TEOA is triethanolamine, NMP is N-methylpyrrolidone, PPOH is propyleneglycol phenylether, DPGME is dipropyleneglycol monomethyl ether, PGMEA is propyleneglycol monomethylether acetate, n-BA is n-butyl acetate, PGME is propyleneglycol monomethyl ether, POEO is polyoxyethyl octylphenyl ether, and ES is sodium lauryl sulfate.

Physical Property Test

Sample preparation: A commonly used color resist composition (FujiFilm Arch's CR-8131L, CG-8130L, CB-8140L, CR-8100L, CG-8100L, and CB-8100L) was spin-coated on LCD glass substrates on which a Cr BM (black matrix) had been deposited, so that the final film thickness becomes 1.0 to 2.0 μm. Samples were prepared by vacuum-drying the substrates in a chamber (0.5 torr) for 60 sec.

The glass substrates were dipped in the thinner compositions of Examples 1 to 8 and Comparative Examples 1 to 4 for 2 sec. After rinsing the substrates with deionized water, the removal status of unwanted films on the edge was observed with the naked eye and an optical electron microscope (LEICA's FTM-200). The results are shown in Table 2.

TABLE 2

| Classification | Resist removing efficiency | |
| --- | --- | --- |
| | Naked eye | Optical electron microscope |
| Example 1 | Good | Good |
| Example 2 | Good | Good |
| Example 3 | Good | Good |
| Example 4 | Good | Good |
| Example 5 | Good | Good |
| Example 6 | Good | Good |
| Example 7 | Good | Good |
| Example 8 | Good | Good |
| Comp. Example 1 | Poor | Poor |
| Comp. Example 2 | Good | Poor |
| Comp. Example 3 | Poor | Poor |
| Comp. Example 4 | Poor | Poor |

As shown Table 2, thinner compositions according to the present invention (Examples 1 to 8) showed good resist-removing efficiency. On the contrary, thinner compositions of Comparative Examples 1 to 4 showed poor resist-removing efficiency.

As explained above, the thinner composition for removing resist of the present invention has good efficiency for removing unwanted resist film constituents formed on the edge of the resist film or at the back of the substrate in TFT-LCD device and semiconductor device manufacturing processes. Also, it does not have the problem of equipment corrosion.

What is claimed is:

1. A thinner composition for removing resist, comprising:
   a) 0.1 to 5 wt % of an inorganic alkali compound;
   b) 0.1 to 5 wt % of an organic amine;
   c) 0.1 to 30 wt % of an organic solvent;
   d) 0.01 to 5 wt % of a surfactant comprising an anionic surfactant and a non-ionic surfactant in the weight ratio of 1:5 to 1:25; and
   e) 60 to 99 wt % of water.

2. The thinner composition for removing resist according to claim 1, wherein the inorganic alkali compound is one or more compounds selected from potassium hydroxide, sodium hydroxide, sodium phosphate, sodium silicate, sodium carbonate, and sodium hydrogen carbonate.

3. The thinner composition for removing resist according to claim 1, wherein the organic amine is one or more compounds selected from monoethanolamine, diethanolamine, triethanolamine, monoethylamine, diethylamine, triethylamine, ethyleneglycol amine, propyleneglycol amine, butyleneglycol amine, diethyleneglycol amine, and dipropyleneglycol amine.

4. The thinner composition for removing resist according to claim 1, wherein the organic solvent is one or more compounds selected from ethyleneglycol phenylether, propyleneglycol phenylether, butyleneglycol phenylether, diethyleneglycol phenylether, dipropyleneglycol phenylether, N-methylpyrrolidone (NMP), N-ethyl pyrrolidone (NEP), N-propyl pyrrolidone (NPP), N-hydroxymethyl pyrrolidone, and N-hydroxyethyl pyrrolidone.

5. The thinner composition for removing resist according to claim 1, wherein the anionic surfactant is sodium lauryl sulfate or sodium alkyl sulfate.

6. The thinner composition for removing resist according to claim 1, wherein the non-ionic surfactant is one or more compounds selected from polyoxyethyl ether, polyoxypropyl ether, polyoxyethyl octylphenyl ether, polyoxypropyl octylphenyl ether, polyoxyethyl propyl ether, and polyoxyethylpropyl octylphenyl ether.

* * * * *